United States Patent [19]

Kinghorn

[11] Patent Number: 4,584,567
[45] Date of Patent: Apr. 22, 1986

[54] DIGITAL CODE DETECTOR CIRCUITS

[75] Inventor: John R. Kinghorn, Sutton, United Kingdom

[73] Assignee: U.S. Philips Corporation, New York, N.Y.

[21] Appl. No.: 665,270

[22] Filed: Oct. 26, 1984

[30] Foreign Application Priority Data

Oct. 26, 1983 [GB] United Kingdom ................ 8328622

[51] Int. Cl.[4] ......................................... H03K 19/082
[52] U.S. Cl. ............................ 340/347 DD; 307/463
[58] Field of Search ................ 340/347 AD, 347 DD; 365/241, 230, 231, 238; 307/463, 464

[56] References Cited

U.S. PATENT DOCUMENTS 3,142,056  7/1964  Martin ......................... 340/347 AD
3,284,794 11/1966  Bean ............................. 340/347 AD Primary Examiner—Charles D. Miller
Attorney, Agent, or Firm—Thomas A. Briody; William J. Streeter; Leroy Eason

[57] ABSTRACT

A digital code detector circuit for detecting on a priority basis those code combinations of an n-bit binary digital code (n>3) which contain only a single bit of a first binary value (e.g. the code combinations 1000, 0100, 0010 and 0001 of a 4-bit binary digital code). The circuit comprises a set of n input leads with associated inverters to supply the inverse of the input code combinations as well as the input code combinations to a logic gating arrangement. The gating arrangement drives m output circuits, where the m is the number of bits of output address code combinations corresponding to each possible input code combination of n-bits. When more than one of the input code combinations containing only a single bit of the fixed binary value are present concurrently on the set of input leads, the gating arrangement is such that only the m-bit address code for the input code combination having the higher binary value is produced by the output circuits.

4 Claims, 4 Drawing Figures

DIGITAL CODE DETECTOR CIRCUITS

This invention relates to digital code detector circuits of a kind suitable for detecting binary digital codes represented by a set of data signals of each of which a first logic level represents one binary value (say high=1) and a second logic level represents the opposite binary value (say low=0).

There are situations in digital circuit arrangements where of all the possible code combinations of an n-bit binary digital code (n>3), only those code combinations which contain only a single bit of one binary value (e.g. a single 1-bit) are used as identification codes. For instance, a plurality of memory circuits can have individual ones of those code combinations allocated to them, these code combinations being produced on a common set of identification leads for detection when their respective memory circuits are to be identified, for example for data read out.

The organisation of a digital circuit arrangement may require that data is to be read out from only one of the memory circuits at a time. Therefore, if the code combinations for more than one of the memory circuits are present concurrently on the common set of identification leads, a selection of one of these code combinations becomes necessary to identify a particular memory circuit for data read out. However, when two or more of the code combinations are present concurrently, they corrupt one another to produce a resultant code combination containing two or more bits of said one binary value. This poses a problem in the detection of the bona fide code combinations which contain only a single bit of one binary value.

A similar problem is dealt with in prior UK patent specification No. 1 225 048 which relates to resolving the priority of parallel signals in electrical communication systems and in data processing systems. This prior UK patent specification describes apparatus which is operable to recognise the highest priority signal among signals on a multiplicity of communication channels and to encode the recognised signal. The apparatus has input means for receiving TRUE and NOT signals for each channel, output terminal means for the bit signals representing the number to be encoded, and encoding means electrically connected to said input means and to said output terminal means for receiving preselected TRUE and NOT channel signals from said input means and directly encoding the bit signals of the highest priority channel providing a signal. In the specific form of apparatus which is described in this prior UK patent specification, the encoding means has one group of coincidence gates for each bit of the bit signal. In order to simplify the logic, the TRUE and NOT channel signals are fed to these gates with a preselection appropriate for producing the ONE's complement of each of the bits of the highest priority channel number. No specific circuit implementation of the apparatus is given.

Prior U.S. Pat. No. 3,825,888 relates to decoder circuits, and in particular to such circuits which are implemented using insulated gate field effect transistors (IGFETS). The circuit arrangements described in this prior USA patent specification form gate configurations which comprise series and/or parallel combinations of IGFETS which are switched selectively in response to TRUE and NOT input signals to produce decoded output signals. However, none of these gate configurations is suitable for recognising and responding to the highest priority input signal among a number of simultaneously applied input signals.

It is an object of the present invention to provide a digital code detector circuit which can detect on a priority basis one of a number of simultaneously applied input signals, and which comprises gate configurations requiring simpler logic than used for the apparatus described in the above-identified UK patent specification.

It is a further object of the present invention to form the required gate configurations using an advantageous arrangement of IGFETS.

According to the invention, there is provided a digital code detector circuit of the kind set forth above which is arranged to detect only those combinations of an n-bit (n>3) binary code which contain only a single bit of first binary value; the digital code detector circuit comprises a set of n-input leads for receiving to data signals presenting the n bits of any of these n input code combinations concurrently, inverter means for producing a set of the corresponding inverse data signals whose logic levels are opposite to those of the received true set of data signals, a plurality (m) of output circuits for producing binary output address codes, where m is the number of bits required in an output address code to provide a unique m-bit output address code combination for each of the n input code combinations, and a gating arrangement which drives for the output circuits and is operable to perform gating functions such that when more than one n-bit input code combination having a single bit of the first binary value is present concurrently on the set of input leads, the output circuits are operated to produce the m-bit address code combination for the n-bit input code combination having the highest binary value. The gating arrangement comprises each input lead of circuit (except that pertaining to the least significant input code bit), a number of m of first gating devices which pertain respectively to the output circuits and which are all enabled by an inverse data signal of said one binary value as derived by the relevant inverter means from a true data signal of opposite value applied to the input lead. The gating arrangement further comprises, for certain input leads of the circuit, one or more second gating devices which one enabled by a data signal of said one binary value applied to the input lead, these second gating devices pertaining respectively to those output circuits which are to provide a bit of the first binary value in the address code combination for the particular input code combination which contains only a single bit of the first binary value.

It is to be understood that the word higher (or highest) as used above is to be interpreted in a relative sense having regard to which binary (logic) value is chosen to define the bits of the n input code combinations.

A digital code detector circuit according to the invention is eminently suited for implementation as an integrated circuit that includes what will be termed an "array logic structure" which can be used to form so-called combinational logic circuits (that is, circuits which can perform combinations of logic functions, such as AND and OR functions).

For the purposes of the present specification an "array logic structure" is hereindefined as a plurality of gating devices consisting of controllable insulated gate field effect transistors (IGFETS) which are formed at selected intersections of an array consisting of a plurality of rows of series-connected gate regions and a plurality of columns of surface regions which at each selected intersection define source and drain regions for the transistor which is formed there, an electrical path being formed at each other (non-selected) intersection, at least in use of the structure, to effectively short circuit the intersection in respect of the relevant surface column region.

In one known form of this array logic structure, the controllable transistors at the selected intersections are n-channel IGFETS of the enhancement type, and at the non-selected intersections are n-channel IGFETS of the depletion type to provide the electrical paths which short circuit (or bridge) these latter intersections in the direction of the relevant surface region column. Further information concerning such an array logic structure can be found in United Kingdom patent specification No. 1 575 741.

In order that the invention may be more fully understood, reference will now be made by way of example to the accompanying drawings, of which:

Figures 1, 2:
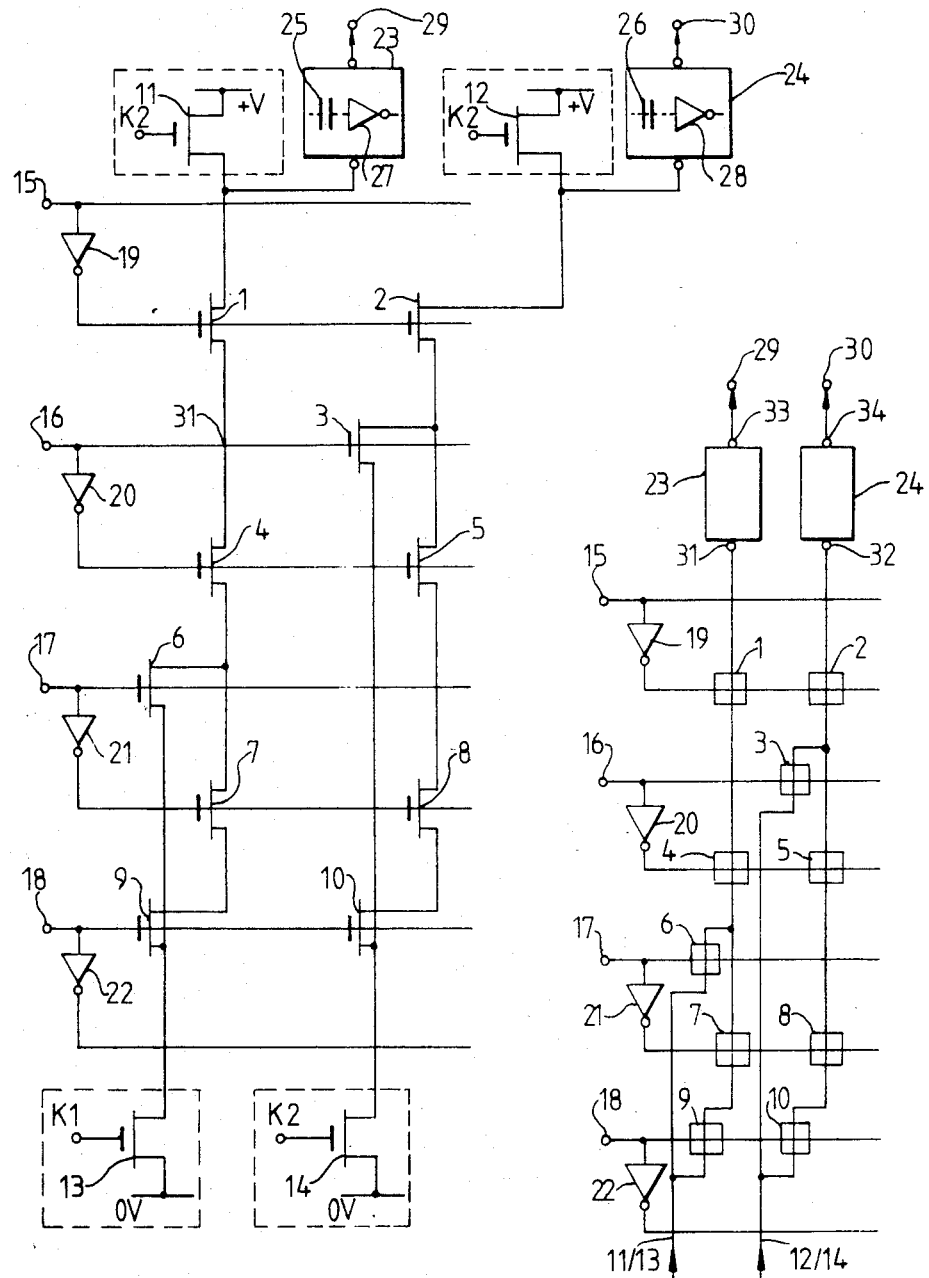
FIG. 1 shows one embodiment of a digital code detector circuit according to the invention.
FIG. 2 shows a schematic diagram of the circuit shown in FIG. 1.

Referring to the drawings, the digital code detector circuit shown in FIG. 1 comprises an array of ten gating devices such as transistors 1 to 10 connected between two pairs of drive transistors 11/13 and 12/14 across supply rails (+V), (0V). The array is fed with true data signals from a set of four input leads 15 to 18. The bits of these true data signals can have either a high logic level or a low logic level, corresponding to logic levels 1 and 0, respectively. Inverse data signals are derived from the true data signals by respective inverters 19 to 22. The array drives two output circuits 23 and 24, each of which includes an input storage capacitor 25, 26, as will be considered in more detail later in this specification.

In operation of the circuit, the drive transistors 11,12 and 13,14 receive pulses K2 and K1, respectively, at their gates. These pules K2 and K1 are two phase in that they occur alternately without overlap in time. The occurence of a pulse K2 switches on transistors 11 and 12 for the period of this pulse and the capacitors 25 and 26 are both pre-charged to the voltage +V which corresponds to the high logic level. On the occurrence of the immediately following pulse K1, both the transistors 13 and 14 are switched on, by which time the transistors 11 and 12 will be switched off again. In dependance on the logic levels of the bits at the set of input leads 15 to 18, different combinations of the transistors 1 to 10 can be switched on and off to complete or not a number of paths through the array. With the transistors 13 and 14 switched on, one or both of the capacitors 25 and 26 will discharge through a respective completed path to the voltage 0V which corresponds to the low logic level. If no discharge paths are estabilished through the array when the pulse K1 occurs, the capacitors 25 and 26 will retain the high level. In each output circuit, the prevailing logic level is inverted by a respective inverter 27, 28 to produce the correct logic level at the output 29, 30 of the output circuit 23, 24. As implemented by an array logic structure, the transistors 1 to 10 can be enhanced type IGFETS. At each of the inter-sections in the array where two crossover leads are electrically insulated from each other, depletion type IGFETS can be used to form the intersection.

A convenient way of illustrating the circuit of FIG. 1 is by means of a schematic diagram of the form shown in FIG. 2. In this schematic diagram, which will now be used to further describe the operation of the digital code detector circuit, the gating transistors forming the array are represented by the small rectangles 1 to 10, respectively. At each intersection of the array where no gating transistor is provided, electrical isolation between the two crossover leads is assumed. Because the output circuits 23, 24 each receive a low logic level signal in response to "gated" high logic level signals (i.e. when a discharge path 11/13 or 12/14 is completed) the input 31, 32 to each output circuit is given an "inverter" circle to signify that a low logic level signal thereat corresponds to a binary 1 input signal. The "inverter" circle at the output 33,34 of each output circuit signifies that a (high logic level) binary 0 signal is produced in response to a binary 1 (low logic level) input signal. The two-phase action of the pulses K1 and K2 is assumed to be implicit in the operation. Further consideration of the invention will now be with reference to the schematic diagram of FIG. 2, and also that of FIG. 3.

The circuit represented by the schematic diagram of FIG. 2 is for detecting any one of the four code combinations 1000, 0100, 0010 and 0001 as represented by the logic levels of the true data signals applied to the set of four input leads 15, 16, 17 and 18 either singly, or two or more concurrently. Where two or more of such four code combinations occur concurrently, the one which effectively has the highest binary numerical value is selected in preference to the other code combination(s). The selection takes the form of a 2-bit binary code which is produced as a priority address code by the two output circuits 23 and 24. It will be apparent that for the concurrent application of one, two, three or all four of the code combinations to the set input leads, the effective logic levels on these leads will consist of all sixteen possible combinations of 1 and 0 logic levels of a 4-bit code. These combinations will effect logic gating within the circuit as set forth in the following TABLE I.

TABLE I

| Input Leads | | | | Gating Transistors | Output Address Code | |
| --- | --- | --- | --- | --- | --- | --- |
| 15 | 16 | 17 | 18 | "On" | 23 | 24 |
| 0 | 0 | 0 | 1 | 1,2,4,5,7,8,9,10 | 1 | 1 |
| 0 | 0 | 1 | 0 | 1,2,4,5,6 | 1 | 0 |
| 0 | 0 | 1 | 1 | 1,2,4,5,6,9,10 | 1 | 0 |
| 0 | 1 | 0 | 0 | 1,2,3,7,8 | 0 | 1 |
| 0 | 1 | 0 | 1 | 1,2,3,7,8,9,10 | 0 | 1 |
| 0 | 1 | 1 | 0 | 1,2,3,6 | 0 | 1 |
| 0 | 1 | 1 | 1 | 1,2,3,6,9,10 | 0 | 1 |
| 1 | 0 | 0 | 0 | 4,5,7,8 | 0 | 0 |
| 1 | 0 | 0 | 1 | 4,5,7,8,9,10 | 0 | 0 |
| 1 | 0 | 1 | 0 | 4,5,6, | 0 | 0 |
| 1 | 0 | 1 | 1 | 4,5,6,9,10 | 0 | 0 |
| 1 | 1 | 0 | 0 | 3,7,8 | 0 | 0 |
| 1 | 1 | 0 | 1 | 3,7,8,9,10 | 0 | 0 |
| 1 | 1 | 1 | 0 | 3,6 | 0 | 0 |
| 1 | 1 | 1 | 1 | 3,6,9,10 | 0 | 0 |

It can be seen from this table the four bona fide code combinations 1000, 0100, 0010 and 0001 are detected as binary address code 00, 01, 10 and 11, respectively. Also, only one of these four possible binary address codes is produced, whatever effective input code combination obtains. Furthermore, the particular binary code which is produced is selected on a priority basis, depending which of the four bona fide code combinations are present concurrently. For instance, when 1000 is present, the binary address code is always 00, irrespective of whether one or more of 0100, 0010 and 0001 are also present (i.e. to give 1100, 1010, 1001, etc., as the effective input combination). Similarly, when 0100 is present, the binary address code is always 01, whatever other bona fide code combinations are also present, and so on.

Figure 3:
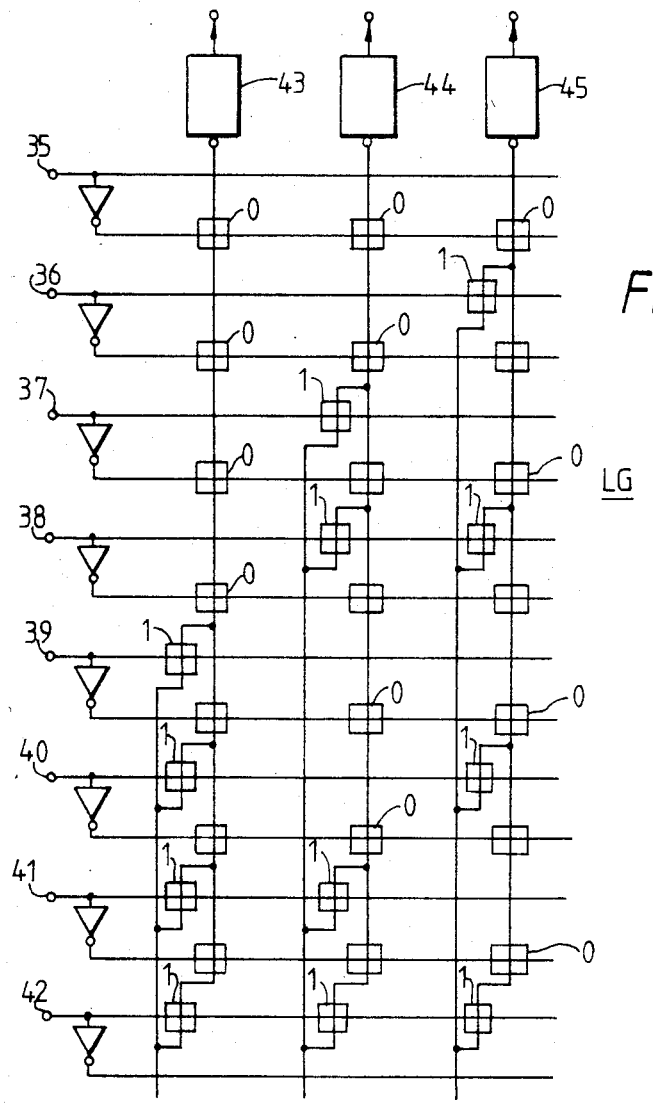
FIG. 3 shows a schematic diagram of another embodiment of a digital code detector circuit according to the invention.

The schematic diagram of FIG. 3 represents a digital code detector circuit according to the invention which has a set of eight input leads 35 to 42 and a logic gating arrangement LG to detect the eight code combinations 10000000; 01000000; ... 00000001 having a single 1-bit. Because a 3-bit digital code is required for the eight possible binary code addresses, three output circuits 43 to 45 are provided. The following Table II gives the eight input code combinations with their respective binary code addresses.

TABLE II

| Input Leads | | | | | | | | Output Address Code | | |
|---|---|---|---|---|---|---|---|---|---|---|
| 35 | 36 | 37 | 38 | 39 | 40 | 41 | 42 | 43 | 44 | 45 |
| 0 | 0 | 0 | 0 | 0 | 0 | 0 | 1 | 1 | 1 | 1 |
| 0 | 0 | 0 | 0 | 0 | 0 | 1 | 0 | 1 | 1 | 0 |
| 0 | 0 | 0 | 0 | 0 | 1 | 0 | 0 | 1 | 0 | 1 |
| 0 | 0 | 0 | 0 | 1 | 0 | 0 | 0 | 1 | 0 | 0 |
| 0 | 0 | 0 | 1 | 0 | 0 | 0 | 0 | 0 | 1 | 1 |
| 0 | 0 | 1 | 0 | 0 | 0 | 0 | 0 | 0 | 1 | 0 |
| 0 | 1 | 0 | 0 | 0 | 0 | 0 | 0 | 0 | 0 | 1 |
| 1 | 0 | 0 | 0 | 0 | 0 | 0 | 0 | 0 | 0 | 0 |

It can be seen that, in general, for a given address code priority order, the first input lead (15 or 35) of a digital code detector arrangement according to the invention has for each output circuit a gate which is enabled by the inverse logic level, the last input lead (18 or 42) has for each output circuit a gate which is enabled by the true logic level, and each of the intermediate input leads (16–17; 36–41) has for each output circuit a gate which is enabled by the inverse logic level, and for each of the output circuits one or more further gates which are enabled by the true logic level, these further gates being positioned in correspondence with the particular address codes which are allocated to input code combinations having a the single bit of the high logic level for enabling these further gates.

Figure 4:
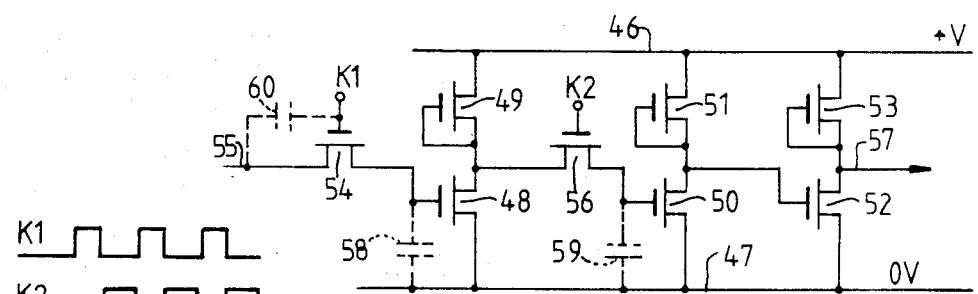
FIG. 4 shows an output circuit for the two embodiments.

For the sake of completeness in the description, FIG. 4 shows a typical two-phase dynamic circuit which can serve as each of the output circuits 23, 24 and 43, 44, 45 and which is operable synchronously with the array logic structure. The circuit shown in FIG. 4 comprises both enhancement and depletion type insulated gate field effect transistors and is assumed to be implemented as an integrated circuit structure using n-channel technology. For this assumption, the array logic structures with which it is associated would, of course, be implemented using the same technology. Supply rails 46 and 47 of the circuit are connected across a supply voltage (+V), (0V). The circuit has an input stage comprised by two transistors 48 and 49, an intermediate stage comprised by two transistors 50 and 51, and an output stage comprised by two transistors 52 and 53. A first transfer transistor 54 is connected between an input 55 and the input stage, and a second transfer transistor 56 is connected between the input stage and the intermediate stage. The output stage provides a high (1=+V) logic level at an output 57 in response to a low (1=0V) logic level at the input 55. The transistors 48, 50, 52, 54 and 56 are enhancement type IGFETS. The transistors 49, 51 and 53 are depletion type IGFETS and serve as loads for the transistors 48, 50 and 52, respectively.

The circuit of FIG. 4 is driven by the two clock pulses K1 and K2, of different phases, which are used to drive the associated array logic structure. These clock pulses K1 and K2 are applied respectively to the gates of the transfer transistors 54 and 56. In operation of the circuit, the input 55 is at either a high (0=+V) logic level or a low (1=0V) logic level, as determined by the associated array logic structure, the operation of which corresponds to that described previously with reference to FIG. 1. On the occurrence of a clock pulse K1, the transfer transistor 54 is switched on and the prevailing logic level at the input 55 is transferred to the gate of the transistor 48. At the end of the clock pulse K1, the transfer transistor 54 is switched off and the prevailing logic level is maintained at the gate of the transistor 48 by a capacitor 58. The transistor 48 is switched on, or remains switched off, according as the prevailing logic level at the input 55 is the high logic level or the low logic level, to provide the alternate logic level at the junction of transistors 48/49. On the occurrence of the immediately following clock pulse K2, the transfer transistor 56 is switched on and said alternate logic level is transferred to the gate of the transistor 50. At the end of the clock pulse K2, the transfer transistor 56 is switched off and said alternate level is maintained at the gate of the transistor 50 by a capacitor 59. The transistor 50 is switched on, or remains switched off, according as said alternate logic level is the high logic level or the low logic level. The transistor 52 has its gate connected to the junction of transistors 50/51 and thus provides the alternate logic level at the output 57. A capacitor 60 is provided to compensate for possible degradation of the logic level at the input 55. The capacitors 58, 57 and 60 are shown in dotted lines, because it is possible that each can be dispensed with if the gate capacitance of the relevant transistor suffices to perform their function.

I claim:

1. A digital code detector circuit for detecting those (n) input code combinations of an n-bit (n>3) binary code, each bit having a first or a second binary value, which contain only a single bit of the first binary value, comprising:

a set of n input leads for respectively receiving n concurrent input data signals respectively representing the n bits of such code combinations in order of binary significance;

a set of inverter circuits respectively connected to said input leads for producing a set of inverse data signals representing the inverse of the binary values of the input signals at such input leads;

a set of m (m>1) output circuits for producing m-bit binary output address code combinations respectively and uniquely corresponding to those input code combinations which contain only a single bit of the first binary value;

respective sources of pulsed drive voltages for the respective output circuits;

and a network of gating elements connecting each of said output circuits to the corresponding source of drive voltage, such gating elements being controlled by the input data signals and the inverse data signals to gate the drive voltage supplied to each output circuit so that when more than one input code combination containing only a single bit of the first binary value is present concurrently on the set of input leads the output circuit produce only the address code combination corresponding to the one of such concurrent input code combinations having the highest binary value.

2. A digital code detector circuit in accordance with claim 1, wherein said network of gating elements comprises:

a succession of m first gating elements connected to the inverter circuit for each of said input leads other than the inverter circuit for the input lead which receives the input signal bit of least binary significance, each of such first gating elements being enabled when an inverse data signal of said first binary value is produced by the inverter circuit connected thereto;

the successive first gating elements for each input lead being aligned with and serially connected to the corresponding successive first gating elements for each succeeding input lead so as to form successive connection paths, such connecting paths being respectively connected between the successive output circuits and the corresponding driving voltage sources;

and at least one but not more than m second gating elements connected to each of said input leads other than the input lead which receives the input signal bit of greatest binary significance, each of such second gating elements being enabled when an input signal of said first binary value is received at the input lead connected thereto;

each of the second gating elements for any input lead being serially connected between one of the first gating elements for the input of next higher order of binary signficance and the drive voltage source which is connected to the connecting path which includes such first gating element;

whereby when a second gating element for any input lead is eanbled, it provides an alternate path for applying drive voltage to the output circuit which produces an address code including a bit of said first binary value when an input signal bit of said first binary value is received at such input lead.

3. A digital code detector circuit in accordance with claim 2, wherein:

each of said gating elements has a control terminal, a drive terminal and an output terminal;

the control terminals of said first gating elements for each input lead are connected to the inverter circuit for such input lead; the drive terminals of the first gating elements for the input lead which receives the most significant input signal bit are respectively connected to the respective output circuits; and the drive terminals of the first gating elements for each successive input lead are respectively connected to the output terminals of those of the first gating elements for the preceding input lead which are in the same output circuit connecting path;

the control terminals of said second gating elements for any input lead are connected to such input lead; the output terminals of the second gating elements are resepectively connected to the drive voltage sources for which such second gating elements provide a circuit path to the corresponding output circuit; and the drive terminals of the second gating elements are respectively connected to the connecting paths formed by the first gating elements;

whereby the first and second gating elements for each output circuit provide connection paths between such output circuit and the corresponding drive voltage source which are selectively controlled in accordance with the highest binary value of concurrent input code combinations which contain only a single bit of the first binary value.

4. A digital code detector circuit in accordance with claim 3, wherein each of said gating elements is an insulated gate field effect transistor and the complete digital code detector circuit is formed as a single integrated circuit.

* * * * *